(12) United States Patent
Hayashida et al.

(10) Patent No.: US 7,262,829 B2
(45) Date of Patent: Aug. 28, 2007

(54) COATING AND DEVELOPING APPARATUS AND COATING AND DEVELOPING METHOD

(75) Inventors: Yasushi Hayashida, Kumamoto (JP); Yoshitaka Hara, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 53 days.

(21) Appl. No.: 11/239,386

(22) Filed: Sep. 30, 2005

(65) Prior Publication Data

US 2006/0183340 A1 Aug. 17, 2006

(30) Foreign Application Priority Data

Feb. 14, 2005 (JP) ............... 2005-036800

(51) Int. Cl.
*G03B 27/32* (2006.01)
*G03B 27/52* (2006.01)
*G03D 5/00* (2006.01)

(52) U.S. Cl. ............... 355/27; 355/30; 396/611
(58) Field of Classification Search ............ 355/27–30; 396/311, 611; 414/935–937; 118/52, 54
See application file for complete search history.

(56) References Cited

U.S. PATENT DOCUMENTS

| | | | |
|---|---|---|---|
| 5,943,880 A | 8/1999 | Tateyama | |
| 6,261,007 B1 | 7/2001 | Takamori et al. | |
| 6,264,381 B1 | 7/2001 | Ueda | |
| 6,402,400 B1 | 6/2002 | Ueda et al. | |
| 6,471,422 B1 | 10/2002 | Ueda et al. | |
| 6,515,731 B1 * | 2/2003 | Akimoto | 355/27 |
| 6,981,808 B2 * | 1/2006 | Miyata et al. | 396/611 |

FOREIGN PATENT DOCUMENTS

| | | |
|---|---|---|
| JP | 2001-077014 | 3/2001 |
| JP | 2001-176792 | 6/2001 |
| JP | 20049193597 | 7/2004 |

* cited by examiner

*Primary Examiner*—Henry Hung Nguyen
(74) *Attorney, Agent, or Firm*—Smith, Gambrell & Russell, LLP

(57) ABSTRACT

A coating and developing apparatus includes a process block which includes a unit block for coating-film formation which applies a resist, and a unit block for development which performs a developing process, and is separately provided with a coating-film-formation-unit-block transfer mechanism and a developing-process-unit-block transfer mechanism. After a substrate after exposure is transferred to a transfer stage from the interface-block transfer mechanism, the timing for the developing-process-unit-block transfer mechanism to receive the substrate is adjusted in such a way that the time from exposure of the substrate to transfer of the substrate to a heating unit becomes a preset time.

6 Claims, 13 Drawing Sheets

| PHASE | PEB | PEB | PEB | PEB | PEB | PEB | COL | DEV | POST | COL | TRS1 |
|---|---|---|---|---|---|---|---|---|---|---|---|
| 1 | A01 | | | | | | | | | | |
| 2 | → | A02 | | | | | | | | | |
| 3 | | → | A03 | | | | | | | | |
| 4 | | | → | A04 | | | | | | | |
| 5 | | | | → | A05 | | | | | | |
| 6 | A06 | | | | → | | A01 | | | | |
| 7 | → | A07 | | | | | A02 | A01 | | | |
| 8 | | → | A08 | | | | A03 | A02 | A01 | | |
| 9 | | | → | A09 | | | A04 | A03 | A02 | A01 | |
| 10 | | | | → | A10 | | A05 | A04 | A03 | A02 | A01 |
| 11 | | | | | → | | A06 | A05 | A04 | A03 | A02 |
| 12 | | | | | | | A07 | A06 | A05 | A04 | A03 |
| 13 | | | | | | | A08 | A07 | A06 | A05 | A04 |
| 14 | | | | | | | A09 | A08 | A07 | A06 | A05 |
| 15 | | | | | | | A10 | A09 | A08 | A07 | A06 |
| 16 | | | | | | | | A10 | A09 | A08 | A07 |

FIG.11

COATING AND DEVELOPING APPARATUS AND COATING AND DEVELOPING METHOD

BACKGROUND OF THE INVENTION

1. Field of the Invention

The present invention relates to a coating and developing apparatus, and a coating and developing method, which perform a coating process of applying a resist liquid or the like to a substrate, such as a semiconductor wafer or an LCD substrate (glass substrate for liquid crystal display), and a developing process and the like on the substrate after exposure. More particularly, the present invention relates to a technique employed in a coating and developing apparatus to transfer a substrate after exposure from an interface block, intervening between the coating and developing apparatus and an exposure apparatus, to an area where a developing process is to be executed.

2. Description of the Related Art

One of fabrication processes for a semiconductor device or an LCD substrate is a sequence of processes of acquiring a desired pattern by forming a resist film on a substrate, exposing the resist film using a photomask, then performing a developing process. Such a sequence of processes is generally carried out by using a resist pattern forming apparatus that has a coating and developing apparatus which applies and dries a resist liquid and an exposure apparatus connected to the coating and developing apparatus. One example of such an apparatus is disclosed in Unexamined Japanese Patent Application KOKAI Publication No. 2004-193597. The apparatus will be discussed below referring to FIGS. 1 and 2. In the apparatus, carriers C each retaining multiple wafers W are carried onto a carrier stage 11 of a carrier block 1A, and the wafers in the carrier C are transferred to a process block 1B by a transfer arm 12 (see FIG. 2). A sequence of processes for forming a resist film is executed by a coating unit 13A, etc. in the process block 1B, and then the wafers are transferred to an exposure apparatus 1D via an interface block 1C.

The wafers after exposure are returned to the process block 1B again to undergo a developing process in the developing unit 13B, after which the wafers are returned to the original carrier C. Referring to FIG. 1, reference numerals 14A to 14C denote shelf units each comprising a heating unit, a cooling unit, a transfer stage and so forth for performing a predetermined heating process and cooling process on wafers before and after the processing of the coating unit 13A and the processing of the developing unit 13B. The wafers W are transferred between modules in the process block 1B where the wafers W are to be placed, such as individual sections like the coating unit 13A, the developing unit 13B and the shelf units 14A to 14c, by two main transfer mechanisms 15A and 15B provided in the process block 1B. At the time wafers W are subjected to the processes, all the wafers W to be processed are transferred according to a transfer schedule that specifies at which timing each wafer is to be transferred to which module.

FIG. 2 is an explanatory diagram illustrating a transfer path of wafers W in this system. The transfer arm 12 serves to transfer an unprocessed wafer W in a carrier C, placed on the carrier stage 11, to a transfer unit (TRS1), and transfer a processed wafer W, undergone development and placed on a cooling unit (COL4), to the carrier C. The main transfer mechanisms 15A and 15B serve to transfer wafers W on the transfer unit (TRS1) to a hydrophobic process unit (ADH), a cooling unit (COL1), a coating unit (COT), a heating unit (PAB), and a transfer unit (TRS2) in that order, and further transfer wafers W, carried out of the interface block 1C and placed into the heating unit (PEB), to a cooling unit (COL3), a developing unit (DEV), a heating unit (POST), and a cooling unit (COL4) in that order.

The transfer means in the interface block 1C will be discussed below. A main transfer section 18A serves to transfer unexposed wafers W placed on the transfer unit (TRS2), to a periphery exposure apparatus (WEE), a buffer cassette (SBU), and a high-precision temperature regulating unit (COL2) in order, and transfer exposed wafers W, placed on a transfer unit (TRS3), to the heating unit (PEB) by means of an auxiliary transfer section 18B. The auxiliary transfer section 18B serves to transfer wafers W in the high-precision temperature regulating unit (COL2) to a carry-in stage 16 of the exposure apparatus 1D, and transfer wafers W on a carry-out stage 17 of the exposure apparatus 1D to the transfer unit (TRS3).

While parameters, such as the exposure time, the amount of exposure, and the heating temperature and heating time in the heating unit (PEB) which perform baking process on the wafer W after exposure (hereinafter referred to as post-exposure baking unit), are set beforehand in order to acquire the line widths of a target pattern, a preset time elapsed after exposure to the initiation of heating (post-exposure elapsing time) is considered in advance. When a pattern is miniaturized and chemically amplified resist is used, the length of the post-exposure elapsing time after exposure appears to influence the developing result. If the post-exposure elapsing time after exposure fluctuates between wafers, the uniformity of the line widths become low when the line widths of a pattern become smaller in the future, which may result in a lower yield.

To make the post-exposure elapsing time constant, therefore, the heating start point for wafers is adjusted in the post-exposure baking unit (PEB). This post-exposure baking unit (PEB) is provided with a cooling plate which also serves as an exclusive transfer arm movable between an area located horizontally off a heating plate and the heating plate, and adjusts the standby time on the cooling plate of the post-exposure baking unit (PEB) according to the statuses of the main transfer section 18A and the auxiliary transfer section 18B in the interface block 1C in consideration of the maximum time for transferring exposed wafers into the post-exposure baking unit (PEB) after being carried out of the carry-out stage 17 of the exposure apparatus 1D. That is, when the time from the point when exposed wafers are carried out to the carry-out stage 17 to the point when the wafers are transferred into the post-exposure baking unit (PEB) is long, the wafers are transferred directly to the heating plate from the cooling plate, whereas when the time is short, the wafers would stand by on the cooling plate for the time short to the set time.

When wafers stand by in the post-exposure baking unit (PEB), the wafer stay time from the carry-in of the wafers in the post-exposure baking unit (PEB) to the carry-out thereof becomes longer for the standby time is added to the time required for the heating process. While the throughput of the exposure apparatus is increasing, some scheme to improve the throughput is made on the developing apparatus side. When the throughput becomes higher, i.e., when the number of wafers to be processed per unit time in a pattern forming apparatus having a coating and developing apparatus connected to an exposure apparatus is increased, the number of heating units (PEB) provided becomes larger. Given that the number of wafers to be processed per hour in the pattern forming apparatus is 150, wafers are transferred at the interval of 24 seconds (3600 seconds/150).

If the time required for the heating process in the post-exposure baking unit (PEB) is 120 seconds (90 seconds for heating+12 seconds for cooling+18 seconds for transfer), for example, adding 4 seconds to that time as the standby time yields the wafer stay time of 124 seconds in the post-exposure baking unit (PEB). When the transfer cycle time of wafers is 24 seconds, the number of required heating units (PEB) would be 6 for 124 seconds÷24=5.17. However, the post-exposure baking unit (PEB) before the developing process incorporates the cooling plate which serves as an exclusive transfer arm, and is very expensive. An increase in the number of the heating units (PEB) therefore stands in the way of reducing the cost for the apparatus.

Unexamined Japanese Patent Application KOKAI Publication No. 2001-77014 describes that the post-exposure elapsing time is adjusted on the transfer arm in the interface block. This scheme is not practically adaptable to an apparatus having a high throughput for the transfer performance of the transfer arm becomes lower.

BRIEF SUMMARY OF THE INVENTION

Accordingly, it is an object of the present invention to provide a coating and developing apparatus, and a coating and developing method, which can suppress the number of required heating units for heating a substrate after exposure while keeping a high throughput, on the premise that the post-exposure elapsing time from exposure of the substrate to the start of the heating process is made constant.

It is another object of the invention to provide a computer readable storage medium and a computer program, which execute processes in such a coating and developing apparatus.

According to the first aspect of the invention, there is provided a coating and developing apparatus comprising:

a process block which forms a coating film including a resist film on a substrate, develops the coating film after exposure, and performs a heat processing accompanying those film formation and development;

an interface block, provided between the process block and an exposure apparatus which performs an exposure process on the coating film formed on the substrate, for transferring the substrate between the process block and the exposure apparatus;

a transfer stage on which a substrate after exposure from the interface block is temporarily placed at a time of transferring the substrate to the process block; and a control section which controls substrate transfer, wherein after a coating film is formed on a substrate in the process block, the substrate is transferred to the exposure apparatus via the interface block, and a substrate after exposure is returned to the process block via the interface block where post-exposure heating is performed and then a developing process is performed, the process block comprises:

a unit block for coating-film formation having a plurality of process units for performing a series of processes for a coating process, which include a coating unit for applying a coating liquid to a substrate and a heating unit for heating the substrate applied with the coating liquid, and a coating-film-formation-unit-block transfer mechanism for transferring a substrate among the plurality of process units; and a unit block for development having a plurality of process units for performing a series of processes for a developing process, which include a post-exposure heating unit for heating an exposed substrate and a developing-liquid applying unit for applying a developing liquid to the heated substrate after exposure, and a developing-process-unit-block transfer mechanism for transferring a substrate among the plurality of process units, the interface block includes an interface-block transfer mechanism for transferring a substrate between the process block and the exposure apparatus, and the control section adjusts a timing for the developing-process-unit-block transfer mechanism to receive a substrate in such a way that a time for the post-exposure heating unit to start heating after exposure of the substrate becomes a preset time, when the substrate after exposure is transferred to the transfer stage by the interface-block transfer mechanism.

In the coating and developing apparatus, the unit block for development can comprise a plurality of modules on which substrates are to be placed and which include the plurality of process units, the developing-process-unit-block transfer mechanism can have at least two arms, and the control section can perform such control as to execute one transfer cycle by sequentially performing substrate transfer in such a way as to transfer a substrate placed on each of the modules to a module following by one, and to go to a next transfer cycle after the one transfer cycle is finished.

The time preset in the control section for the post-exposure heating unit to start heating after exposure of a substrate can be set to a maximum time in consideration of a latest timing in timings at which the interface-block transfer mechanism receives a substrate after exposure from a carry-out stage in the exposure apparatus after the substrate is carried out to the carry-out stage, and the control section can adjust the timing for the developing-process-unit-block transfer mechanism to receive a substrate from the transfer stage according to a timing at which the interface-block transfer mechanism receives a substrate after exposure from the carry-out stage.

It is preferable that the unit block for coating-film formation and the unit block for development are stacked on each other.

According to the second aspect of the invention, there is provided a coating and developing method which performs a coating and developing process using a coating and developing apparatus comprising:

a process block which forms a coating film including a resist film on a substrate, develops the coating film after exposure, and performs a heat processing accompanying those film formation and development;

an interface block, provided between the process block and an exposure apparatus which performs an exposure process on the coating film formed on the substrate, for transferring the substrate between the process block and the exposure apparatus; and a transfer stage on which the substrate after exposure from the interface block is temporarily placed at a time of transferring the substrate to the process block, the process block comprises:

a unit block for coating-film formation having a plurality of process units for performing a series of processes for a coating process, which include a coating unit for applying a coating liquid to a substrate and a heating unit for heating the substrate applied with the coating liquid, and a coating-film-formation-unit-block transfer mechanism for transferring a substrate among the plurality of process units; and a unit block for development having a plurality of process units for performing a series of processes for a developing process, which include a post-exposure heating unit for heating an exposed substrate and a developing-liquid applying unit for applying a developing liquid to the heated substrate after exposure, and a developing-process-unit-block transfer mechanism for transferring a substrate among the plurality of process units, the interface block includes an interface-block transfer mechanism for transferring a substrate between the process block and the exposure apparatus, and the method comprises:

forming a coating film on a substrate in the unit block for coating-film formation of the process block;

transferring the substrate having the coating film formed thereon to the exposure apparatus by the interface-block transfer mechanism;

transferring a substrate after exposure to the transfer stage by the interface-block transfer mechanism;

transferring the substrate after exposure on the transfer stage to the post-exposure heating unit in the unit block for development;

performing a heat processing on the substrate after exposure by the post-exposure heating unit;

performing a developing process by the developing-liquid applying unit in the developing-process-unit-block transfer mechanism unit block for development; and adjusting a timing for the developing-process-unit-block transfer mechanism to receive a substrate from the transfer stage in such a way that a time for the heating unit to start heating after exposure of the substrate becomes a preset time.

According to the third aspect of the invention, there is provided a computer readable storage medium containing software which, when executed, causes a computer to control a coating and developing apparatus comprising:

a process block which forms a coating film including a resist film on a substrate, develops the coating film after exposure, and performs a heat processing accompanying those film formation and development;

an interface block, provided between the process block and an exposure apparatus which performs an exposure process on the coating film formed on the substrate, for transferring the substrate between the process block and the exposure apparatus; and a transfer stage on which a substrate after exposure from the interface block is temporarily placed at a time of transferring the substrate to the process block, the process block comprises:

a unit block for coating-film formation having a plurality of process units for performing a series of processes for a coating process, which include a coating unit for applying a coating liquid to a substrate and a heating unit for heating the substrate applied with the coating liquid, and a coating-film-formation-unit-block transfer mechanism for transferring a substrate among the plurality of process units; and a unit block for development having a plurality of process units for performing a series of processes for a developing process, which include a post-exposure heating unit for heating an exposed substrate and a developing-liquid applying unit for applying a developing liquid to the heated substrate after exposure, and a developing-process-unit-block transfer mechanism for transferring a substrate among the plurality of process units, the interface block includes an interface-block transfer mechanism for transferring a substrate between the process block and the exposure apparatus, and when executed, the software causes the computer to control the coating and developing apparatus in such a method comprising:

forming a coating film on a substrate in the unit block for coating-film formation of the process block;

transferring the substrate having the coating film formed thereon to the exposure apparatus by the interface-block transfer mechanism;

transferring a substrate after exposure to the transfer stage by the interface-block transfer mechanism;

transferring the substrate after exposure on the transfer stage to the post-exposure heating unit in the unit block for development;

performing a heat processing on the substrate after exposure by the post-exposure heating unit;

performing a developing process by the developing-liquid applying unit in the developing-process-unit-block transfer mechanism unit block for development; and adjusting a timing for the developing-process-unit-block transfer mechanism to receive a substrate from the transfer stage in such a way that a time for the heating unit to start heating after exposure of the substrate becomes a preset time.

According to the fourth aspect of the invention, there is provided a computer control program containing software which, when executed, causes a computer to control a coating and developing apparatus comprising:

a process block which forms a coating film including a resist film on a substrate, develops the coating film after exposure, and performs a heat processing accompanying those film formation and development;

an interface block, provided between the process block and an exposure apparatus which performs an exposure process on the coating film formed on the substrate, for transferring the substrate between the process block and the exposure apparatus; and a transfer stage on which a substrate after exposure from the interface block is temporarily placed at a time of transferring the substrate to the process block, the process block comprises:

a unit block for coating-film formation having a plurality of process units for performing a series of processes for a coating process, which include a coating unit for applying a coating liquid to a substrate and a heating unit for heating the substrate applied with the coating liquid, and a coating-film-formation-unit-block transfer mechanism for transferring a substrate among the plurality of process units; and a unit block for development having a plurality of process units for performing a series of processes for a developing process, which include a post-exposure heating unit for heating an exposed substrate and a developing-liquid applying unit for applying a developing liquid to the heated substrate after exposure, and a developing-process-unit-block transfer mechanism for transferring a substrate among the plurality of process units, the interface block includes an interface-block transfer mechanism for transferring a substrate between the process block and the exposure apparatus, and when executed, the software causes the computer to control the coating and developing apparatus in such a method comprising:

forming a coating film on a substrate in the unit block for coating-film formation of the process block;

transferring the substrate having the coating film formed thereon to the exposure apparatus by the interface-block transfer mechanism;

transferring a substrate after exposure to the transfer stage by the interface-block transfer mechanism;

transferring the substrate after exposure on the transfer stage to the post-exposure heating unit in the unit block for development;

performing a heat processing on the substrate after exposure by the post-exposure heating unit;

performing a developing process by the developing-liquid applying unit in the developing-process-unit-block transfer mechanism unit block for development; and adjusting a timing for the developing-process-unit-block transfer mechanism to receive a substrate from the transfer stage in such a way that a time for the heating unit to start heating after exposure of the substrate becomes a preset time.

The process block is separated into the unit block for coating-film formation and the unit block for development, and the coating-film-formation-unit-block transfer mechanism which transfers a substrate between units for forming a coating film (resist film) in the unit block for coating-film formation and the developing-process-unit-block transfer mechanism which transfers a substrate between units for performing a developing process in the unit block for development are provided, so that the coating and developing apparatus can avoid reducing the throughput even when the developing-process-unit-block transfer mechanism stands by. In this respect, the invention is premised on such a coating and developing apparatus, after a substrate after exposure is transferred to the transfer stage from the interface-block transfer mechanism, the timing for the developing-process-unit-block transfer mechanism to receive the substrate is adjusted in such a way that the time from exposure of the substrate to transfer of the substrate to the heating unit becomes a preset time. When the timing at which a substrate after exposure is transferred the transfer stage is early, for example, the timing at which the developing-process-unit-block transfer mechanism transfers the substrate out of the transfer stage is delayed. Such timing adjustment is carried out at the transfer stage, not in the heating unit after exposure, so that even when the number of the processes per unit time is increased, i.e., when the transfer cycle for a substrate is quickened, an increase in the number of required heating units can be suppressed.

BRIEF DESCRIPTION OF THE SEVERAL VIEWS OF THE DRAWINGS

FIG. 11 is an explanatory diagram illustrating one example of a wafer transfer schedule in a unit block for development;

DETAILED DESCRIPTION OF THE INVENTION

A preferred embodiment of the present invention will now be described referring to the accompanying drawings.

Figure 1:
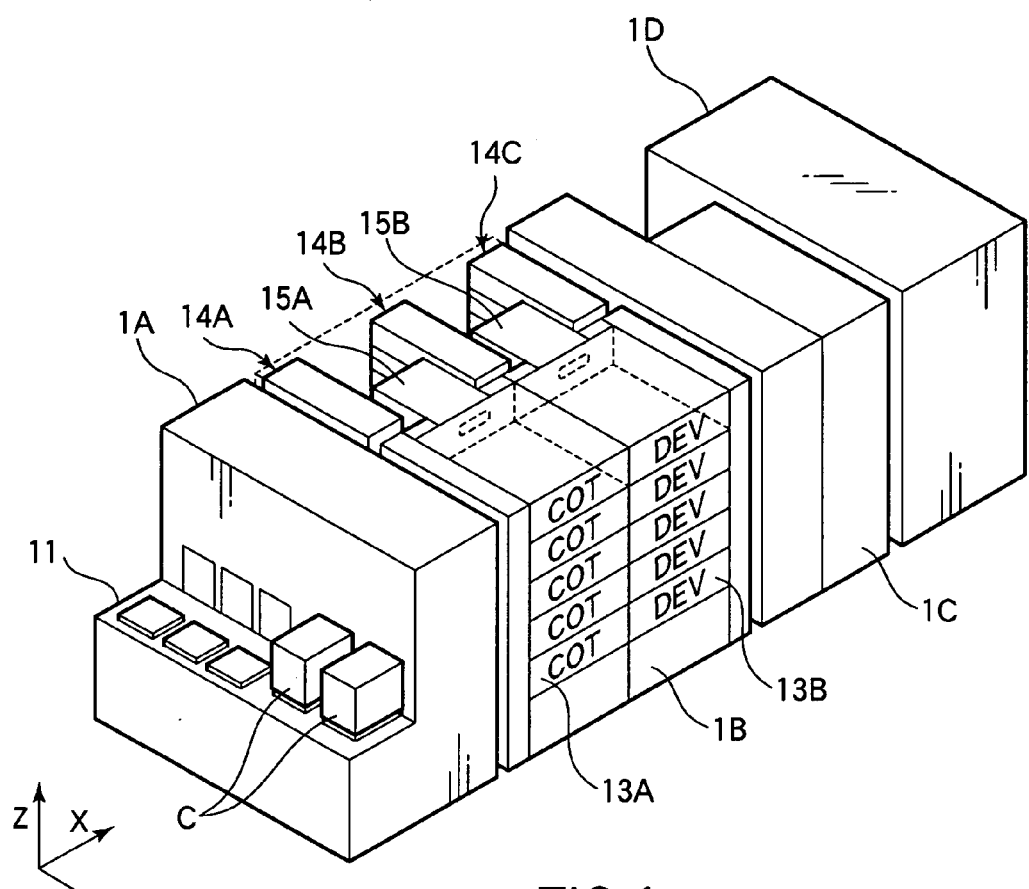
FIG. 1 is a plan view showing a conventional coating and developing apparatus.
Figure 2:
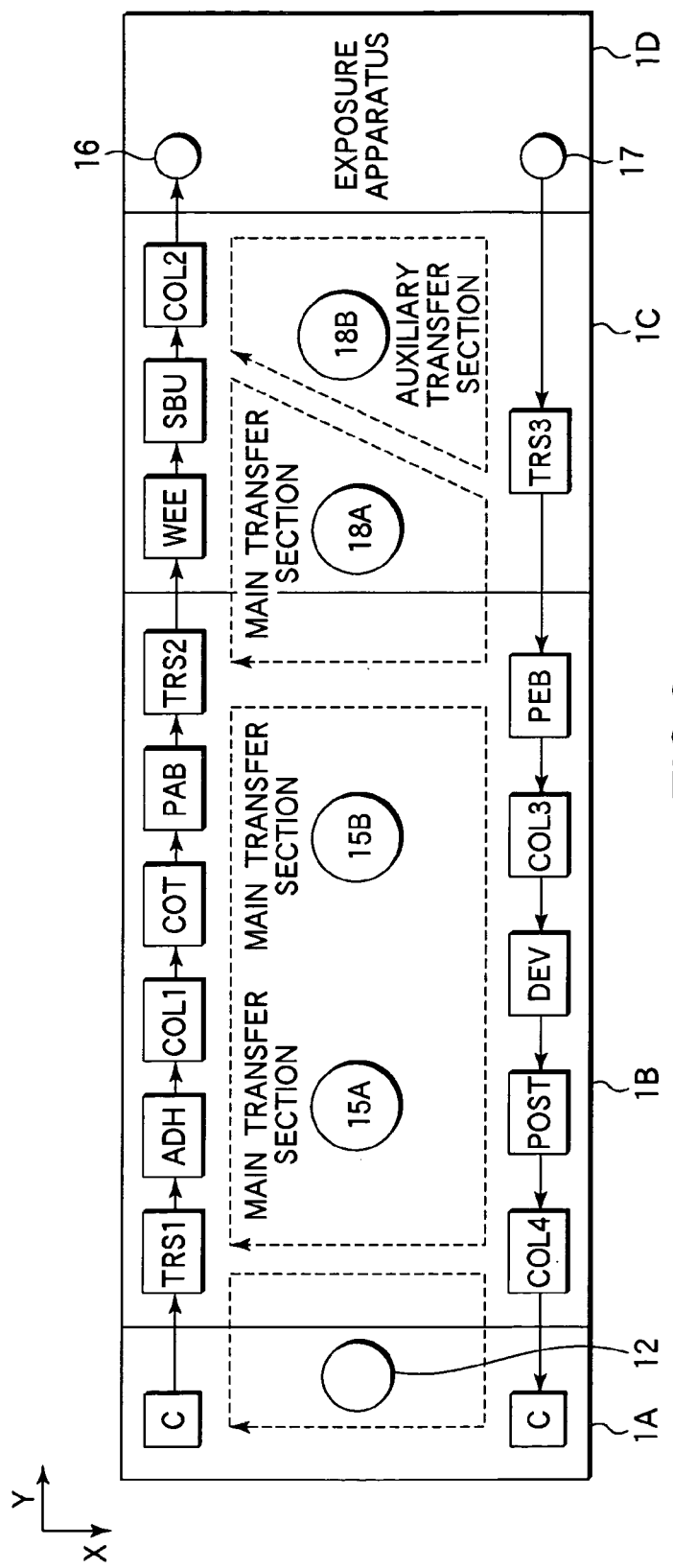
FIG. 2 is an explanatory diagram illustrating the flow of a substrate and the movement of the transfer means in the conventional coating and developing apparatus.
Figure 3:
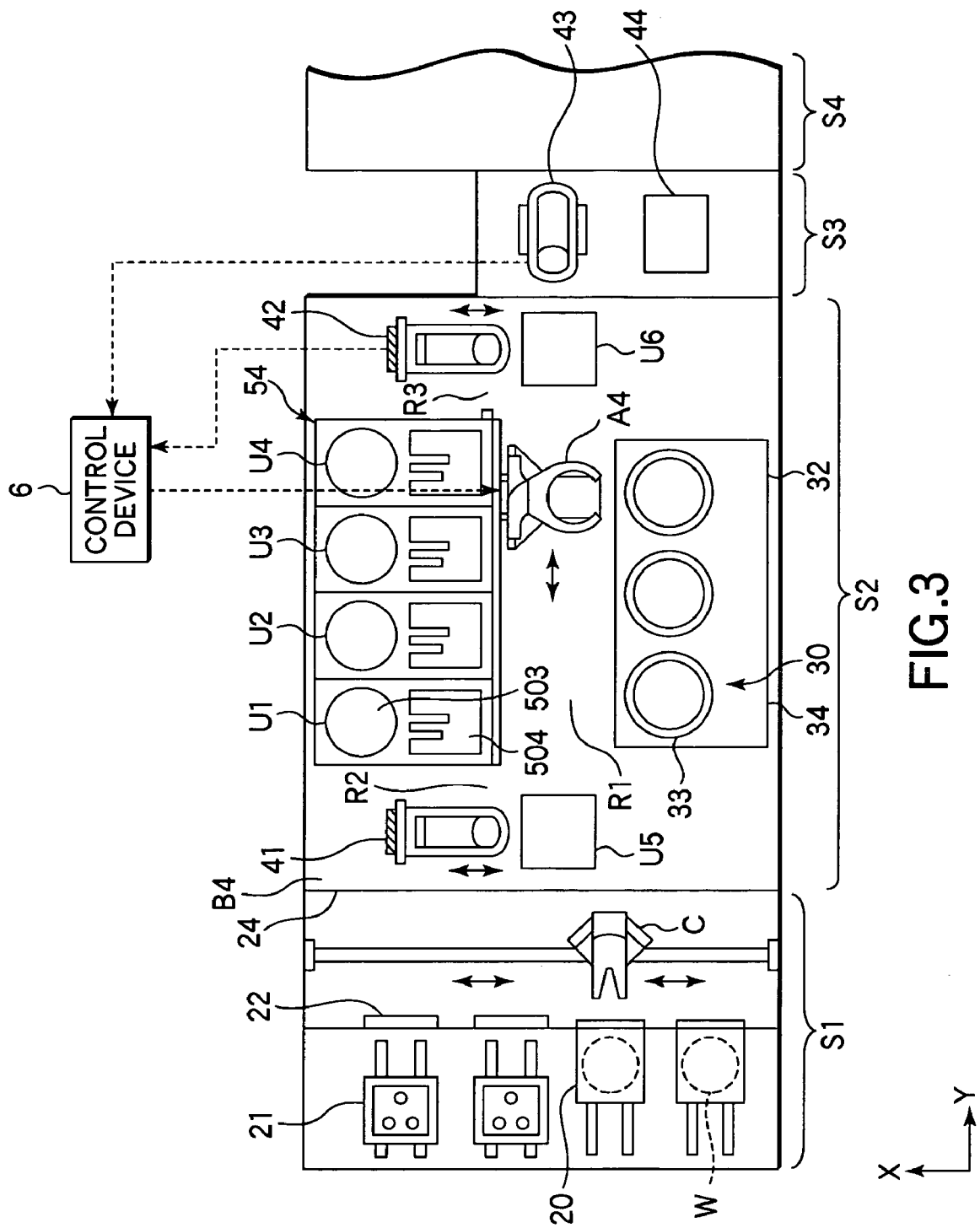
FIG. 3 is a plan view showing a coating and developing apparatus according to one embodiment of the present invention.
Figure 4:
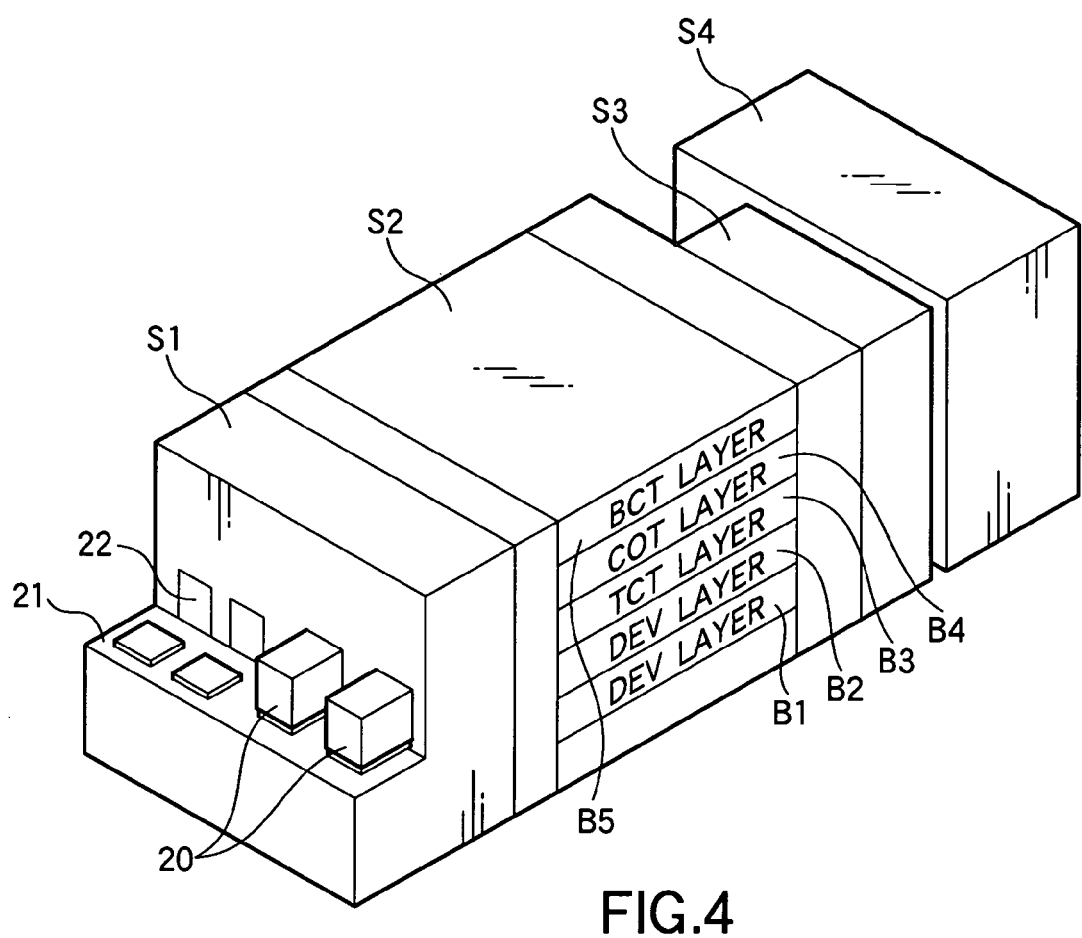
FIG. 4 is a perspective view showing the coating and developing apparatus in FIG. 3.
Figure 5:
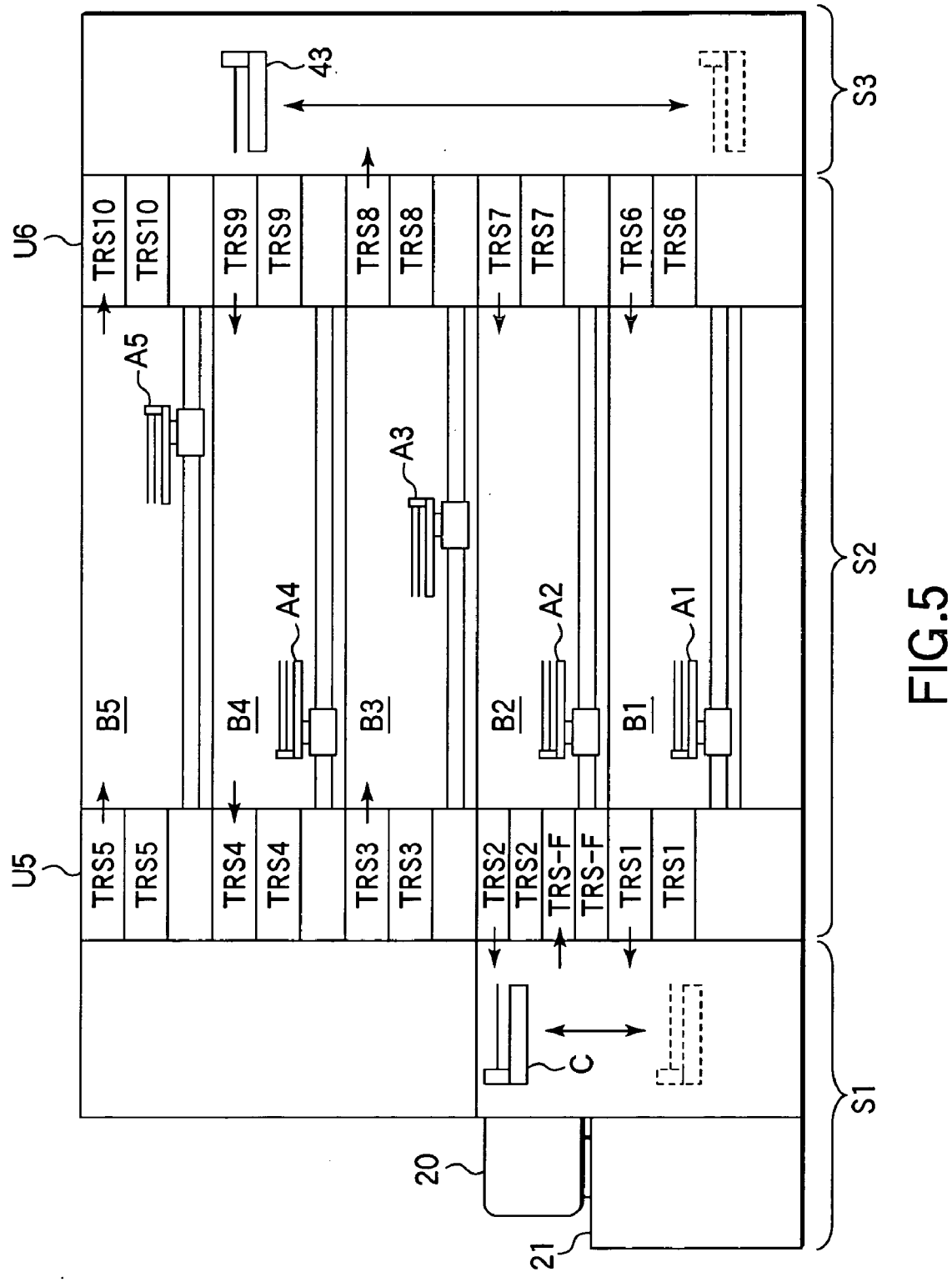
FIG. 5 is a schematic vertical cross-sectional view showing the coating and developing apparatus in FIG. 3.

FIG. 3 is a plan view showing a resist pattern forming apparatus equipped with a coating and developing apparatus according to one embodiment of the present invention, FIG. 4 is a schematic perspective view of the coating and developing apparatus, and FIG. 5 is a schematic vertical cross-sectional view of the coating and developing apparatus. The coating and developing apparatus comprises a carrier block S1 which carries in and out carriers 20 each retaining, for example, thirteen wafers W or substrates in an airtight manner, a process block S2 provided adjacent to the carrier block S1 and having five unit blocks B1 to B5, and an interface block S3 provided on the opposite side of the process block S2 to the carrier block S1. The resist pattern forming apparatus has an exposure apparatus S4 connected to the interface block S3. The operation of the resist pattern forming apparatus is controlled by a control device 6 comprising a computer.

The carrier block S1 includes a table 21 where a plurality of carriers 20 can be mounted, an opening/closing section 22 provided on the front wall as seen from the table 21, and a carrier-block transfer mechanism C which carries wafers W out of the carrier 20 via the opening/closing section 22. The carrier-block transfer mechanism C is so constructed as to be movable forward and backward, liftable, rotatable about the vertical axis, and movable in the layout direction of the carriers 20.

The process block S2, connected to the carrier block S1, is surrounded by a casing 24. The process block S2 has a multistage structure where lower two stages are first and second unit blocks (DEV layers) B1 and B2 which perform a developing process, and a third unit block (TCT layer) B3, which performs a process of forming an antireflection film above a resist film (the antireflection film will be hereinafter called "second antireflection film"), a fourth unit block (COT layer) B4, which performs a process of coating a resist liquid, and a fifth unit block (BCT layer) B5, which performs a process of forming an antireflection film under the resist film (the antireflection film will be hereinafter called "first antireflection film"), are formed in order above the first and second unit blocks B1 and B2. The DEV layers B1 and B2 are equivalent to unit blocks for development, and the TCT layer B3, the COT layer B4 and the BCT layer B5 are equivalent to unit blocks for coating-film formation.

The process block S2 has a shelf unit U5 on its carrier block S1 side and has a plurality of transfer stages placed one on the other and penetrating through the unit blocks B1 to B5, and has a shelf unit U6 on its interface block S3 side and has a plurality of transfer stages placed one on the other and penetrating through the unit blocks B1 to B5.

Next, the structures of the first to fifth unit blocks B1 to B5 will be discussed.

Each of those unit blocks B1 to B5 has a liquid process unit for coating a chemical liquid on wafers W, and a plurality of process units of various processing systems, such as heating and cooling, which perform a pre-process and a post-process to the process that is executed by the liquid process unit. Each of the unit blocks B1 to B5 also has exclusive main transfer arms or transfer mechanisms A1 to A5 for transferring wafers W between the liquid process unit and the heating and cooling units.

As the unit blocks B1 to B5 are constructed with nearly the same layouts, the fourth unit block (COT layer) B4 shown in FIG. 3 will be discussed as a representative example.

Figure 6:
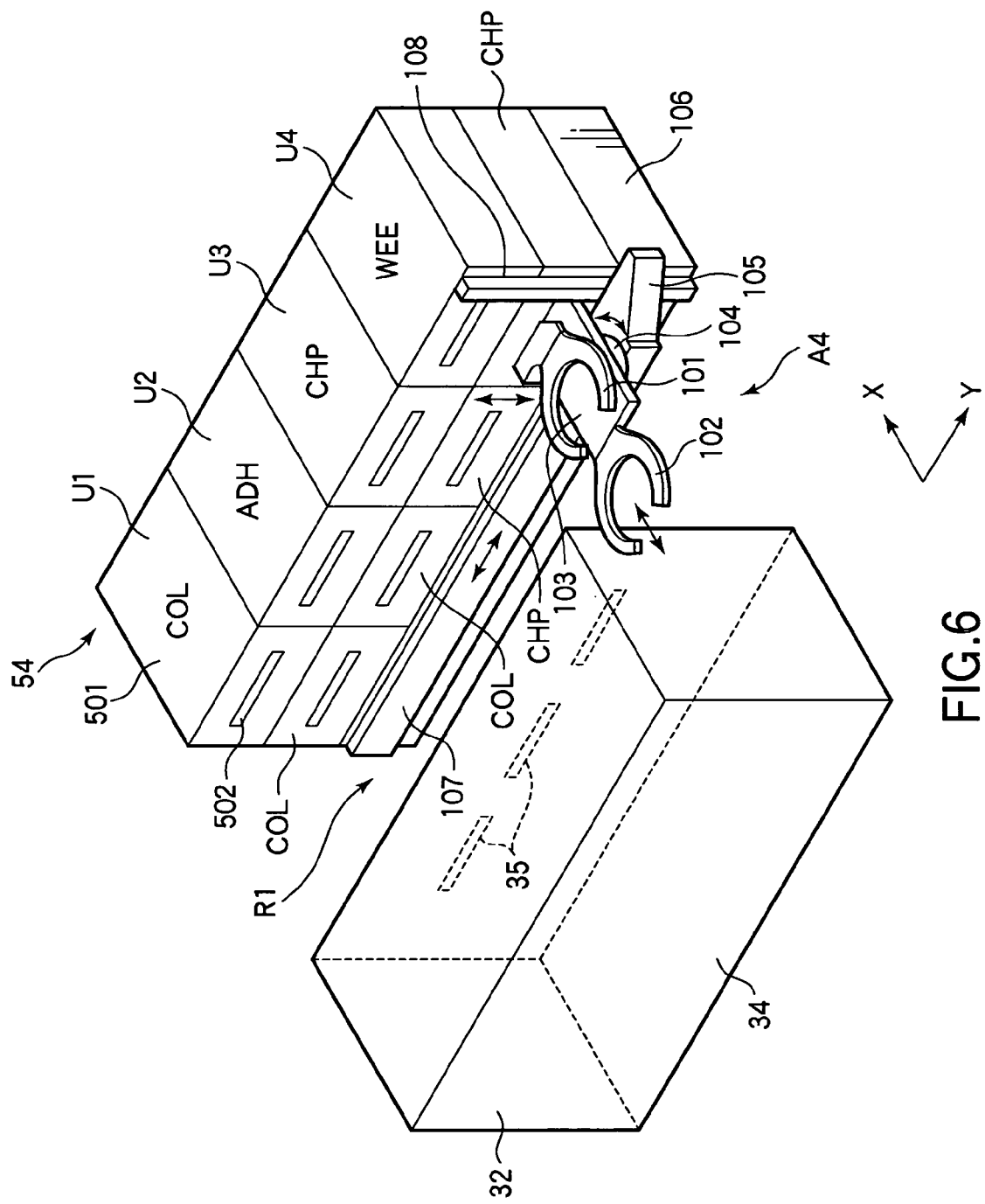
FIG. 6 is a perspective view showing a fourth unit block (COT layer) in the coating and developing apparatus in FIG. 3.

A transfer area R1 for wafers W is formed at nearly the center of the COT layer B4 in such a way as to extend from the carrier block S1 side to the interface block S3 side in the Y direction in the diagram. As the liquid process unit, a coating unit 34 having plural (three in the diagram) coating sections 30 for performing resist coating, and a casing 32, which accommodates the coating sections 30, is provided on the right-hand side of the transfer area R1 as seen from the carrier block S1 side. Each coating section 30 has a wafer holding section (not shown) which rotates a wafer while holding it, and a cup 33 which surrounds the wafer holding section. The coating section 30 supplies a resist liquid to the center portion of a wafer using a nozzle or the like, and rotates the wafer to spread the resist liquid, thereby forming a resist film. As shown in FIG. 6, three wafer inlet/outlet ports 35 are provided at positions corresponding to the coating sections 30.

A heating and cooling section 54 is provided on the left-hand side of the transfer area R1 as seen from the carrier block S1 side. The heating and cooling section 54 includes four shelf units U1, U2, U3 and U4 provided in order from the carrier block S1 side and having heating and cooling units multistaged. Each of the shelf units U1 to U4 of the heating and cooling section 54 has a multilevel structure of various units for performing a pre-process and a post-process to the process which is performed in the coating unit 34, for example, a two-level structure.

As shown in FIG. 6, a plurality of process units which constitute the heating and cooling section 54 and perform a pre-process and a post-process includes a cooling unit (COL) for adjusting the temperature of wafers W to a predetermined temperature before coating a resist liquid, a heating unit (CHP) called a prebaking unit or so for performing a heating process on wafers W after coating of the resist liquid, and a hydrophobic process unit (ADH) which performs a hydrophobic process to improve the adhesion between the resist liquid and the wafer W, and a periphery exposure apparatus (WEE) for selectively exposing only the edge portions of the wafer W. Those process units, such as the cooling unit (COL) and the heating unit (CHP), are accommodated in a process container 501. Each of the shelf units U1 to U4 is constructed by two process containers 501 stacked one on the other, and a wafer inlet/outlet port 502 is formed in that side of each process container 501 which faces the transfer area R1. Note that the hydrophobic process unit (ADH) performs a gas process in the HMDS atmosphere, and should not necessarily be provided in the unit block (COT layer) B4 but should be provided in any one of the unit blocks B3 to B5 for coating-film formation.

The main transfer mechanism A4 is provided in the transfer area R1. The main transfer mechanism A4 is constructed in such a way as to transfer wafers among all the modules (where wafers W are to be placed) in the fourth unit block (COT layer) B4, such as plural process units of the shelf units U1 to U4, plural coating units of the coating unit 34, individual stages of the retaining unit 4, and individual transfer stages of the shelf unit U5 and the shelf unit U6. For this purpose, the main transfer mechanism A4 is so constructed as to be movable forward and backward, liftable, rotatable about the vertical axis, and movable in the Y-axial direction.

As shown in FIG. 6, for example, the main transfer mechanism A4 comprises two arms 101 and 102 for supporting the peripheral area of a wafer W at the back surface thereof, a base 103 which supports the arms 101 and 102 in a forward and backward movable manner, a rotating mechanism 104 which rotates the base 103 about the vertical axis, a moving mechanism 105 which moves the base 103 in the Y-axial direction and in the up-down direction of the transfer area, a Y-axial rail 107, provided on that side of a support 106 which faces the transfer area, in the Y-axial direction, and a lift rail 108 which guides the base 103 in the up-down direction. The support 106 supports the shelf units U1 to U4. The Y-axial rail 107 guides the base 103 in the Y-axial direction. This structure allows the arms 101 and 102 to be movable forward and backward, movable in the Y-axial direction, liftable, and rotatable about the vertical axis, so that wafers W can be transferred among the transfer stages of the shelf units U5 and U6, the process units of the shelf units U1 to U4, and the liquid process unit 34. The main transfer mechanisms A1, A2, A3 and A5 of the other unit blocks have quite the same structures.

That area of the transfer area R1 which is adjacent to the carrier block S1 is a first wafer transfer area R2. As shown in FIGS. 3 and 5, the shelf unit U5 is provided at that position in the area R2 where the carrier-block transfer mechanism C and the main transfer mechanism A4 can access. A first sub-transfer mechanism 41 for transferring a wafer W to and from the shelf unit U5 can pass through the area R2. The first sub-transfer mechanism 41 is movable up and down, penetrating the first to fifth unit blocks B1 to B5 along the shelf unit U5.

That area of the transfer area R1 which is adjacent to the interface block S3 is a second wafer transfer area R3. As shown in FIGS. 3 and 5, the shelf unit U6 is provided at that position in the area R3 where the main transfer mechanism A4 can access. A second sub-transfer mechanism 42 for transferring a wafer W to and from the shelf unit U6 can pass through the area R3. The second sub-transfer mechanism 42 is movable up and down, penetrating the first to fifth unit blocks B1 to B5 along the shelf unit U6.

The shelf unit U5 has first transfer stages TRS1 to TRS5, two each, at the positions corresponding to the unit blocks B1 to B5, as shown in FIG. 5. The first transfer stages TRS1 to TRS5 transfer wafers W to and from the main transfer mechanisms A1 to A5 of the respective unit blocks B1 to B5. The first sub-transfer mechanism 41 is so constructed as to be movable forward and backward and liftable to be able to transfer wafers W to and from the first transfer stages TRS1 to TRS5. Although the first transfer stages TRS1 to TRS5 are provided, two each, in this embodiment, they may be provided, one each, or three or more each.

The first transfer stages TRS1 and TRS2 of the first and second unit blocks B1 and B2 are is constructed in such a way as to transfer wafers W to and from the carrier-block transfer mechanism C of the carrier block S1. The shelf unit U5 further includes two transfer stages TRS-F at portions corresponding to the second unit block B2, and the transfer stages TRS-F are used as exclusive transfer stages with which the carrier-block transfer mechanism C transfers wafers W into the process block S2. The transfer stages TRS-F may be provided in the first unit block B1. Without the transfer stages TRS-F provided separately, wafers W may be transferred into the process block S2 from the carrier-block transfer mechanism C using the first transfer stages TRS1 and TRS2.

Figure 9:
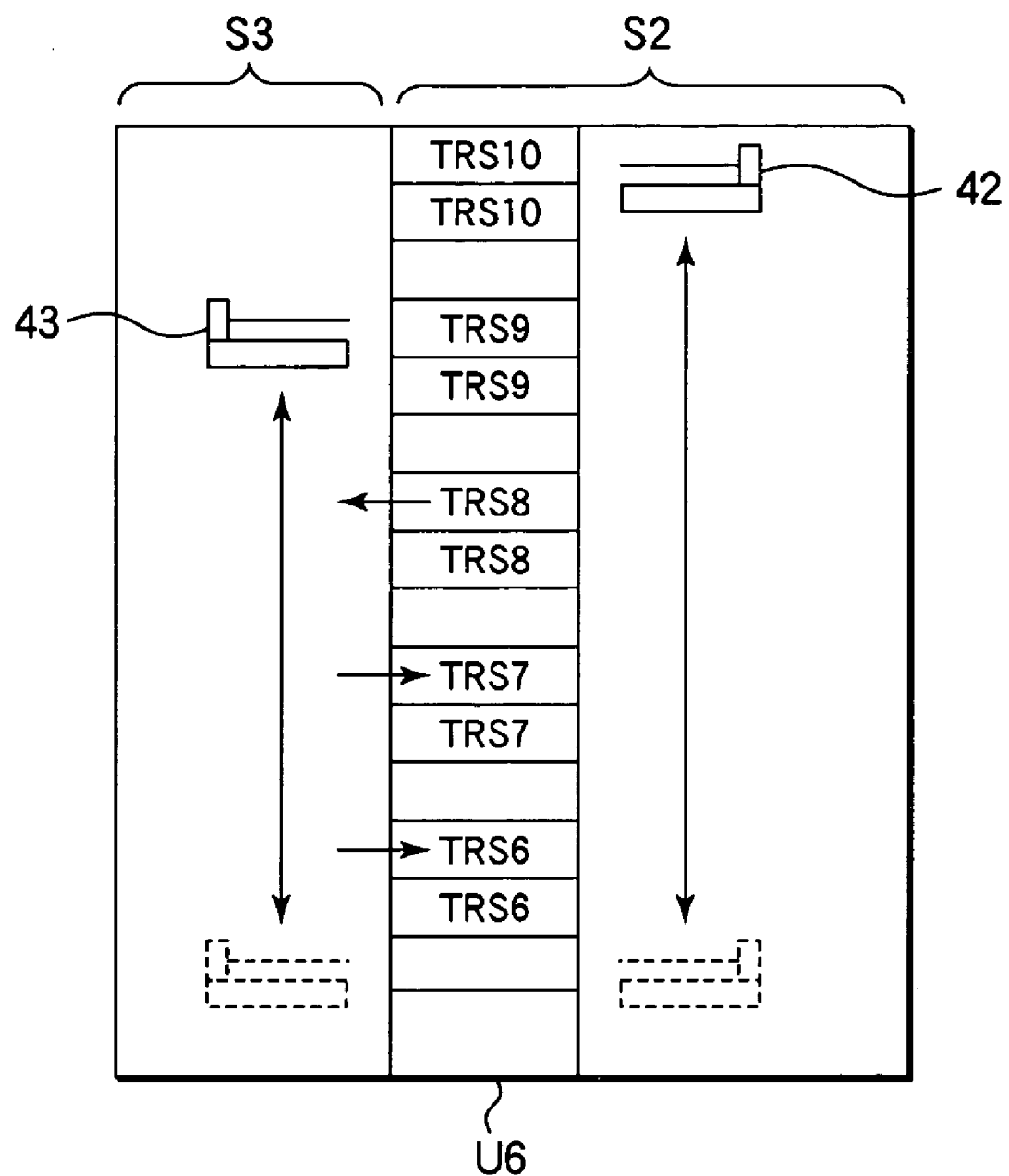
FIG. 9 is a schematic vertical cross-sectional view showing an interface block in the coating and developing apparatus in FIG. 3.

The shelf unit U6 has second transfer stages TRS6 to TRS10, two each, at the positions corresponding to the unit blocks B1 to B5, as shown in FIGS. 5 and 9. The second transfer stages TRS6 to TRS10 transfer wafers W to and from the main transfer mechanisms A1 to A5 of the respective unit blocks B1 to B5. The second sub-transfer mechanism 42 is so constructed as to be movable forward and backward and liftable to be able to transfer wafers W to and from the second transfer stages TRS6 to TRS10. Although the second transfer stages TRS6 to TRS10 are provided, two each, in this embodiment, they may be provided, one each, or three or more each.

The structures of the other unit blocks will now be explained. The TCT layer B3 and the BCT layer B5 have substantially same structures to the structure of the COT layer B4 except that the chemical liquid in the liquid process unit is used in placed of the resist liquid to form an antireflection film, and are respectively provided with a heating unit and a cooling unit, and the main transfer mechanisms A3 and A5 each of which transfers a substrate among those units.

Figure 7:
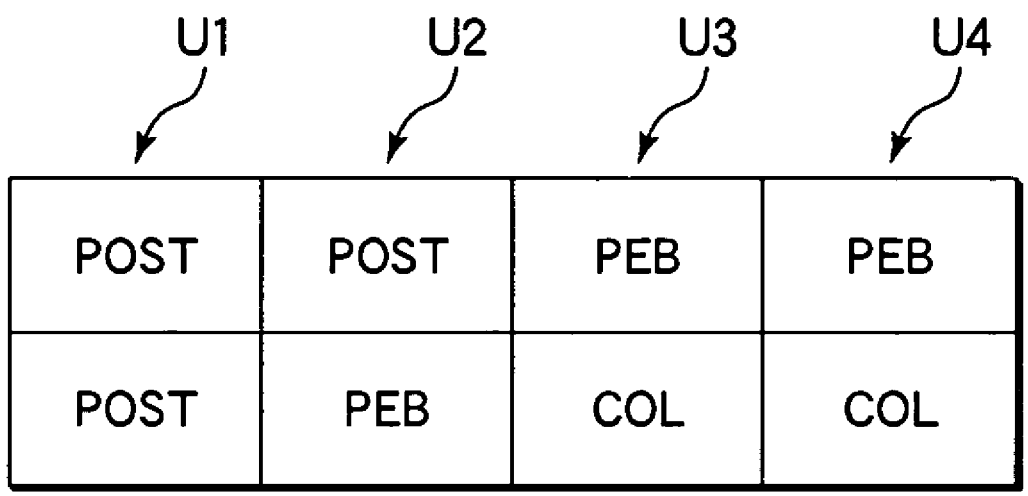
FIG. 7 is an exemplary diagram showing shelf units U1 to U4 of a first unit block (DEV layer) in the coating and developing apparatus in FIG. 3.

The DEV layer B1 is provided, as a liquid process unit, with a developing unit for performing a developing process on wafers W. As shown in FIG. 7, the DEV layer B1 is constructed in the same way as the COT layer B4 except that each of the shelf units U1 to U4 has a post-exposure baking unit (PEB), which is heating unit performing a heating process on a wafer W after exposure, a cooling unit (COL) for adjusting the temperature of a wafer W to a predetermined temperature after the processing is done in the post-exposure baking unit (PEB), and a heating unit (POST), called a postbaking unit, which performs a heating process to dry out water on wafers W after a developing process. Although the DEV layer B2 is constructed in nearly the same way as the DEV layer B1, the DEV layer B2 needs to have two post-exposure heating units (PEB) for a total of five post-exposure heating units (PEB) are provided in the embodiment. The developing unit holds a wafer at the wafer holding section surrounded by the cup, performs the developing process with a developing liquid supplied through the chemical liquid nozzle, then rinses the wafer surface with a rinse liquid, and rotates the wafer holding section to dry the wafer surface, and has nearly the same structure as the coating unit in FIG. 3.

At each of the DEV layers B1 and B2, wafers W are transferred among the first transfer stages TRS1, TRS2, TRS-F, the second transfer stages TRS6, TRS7, the developing unit, the individual process units of the shelf units U1 to U4 by the associated main transfer mechanism A1, A2.

Figure 8A:
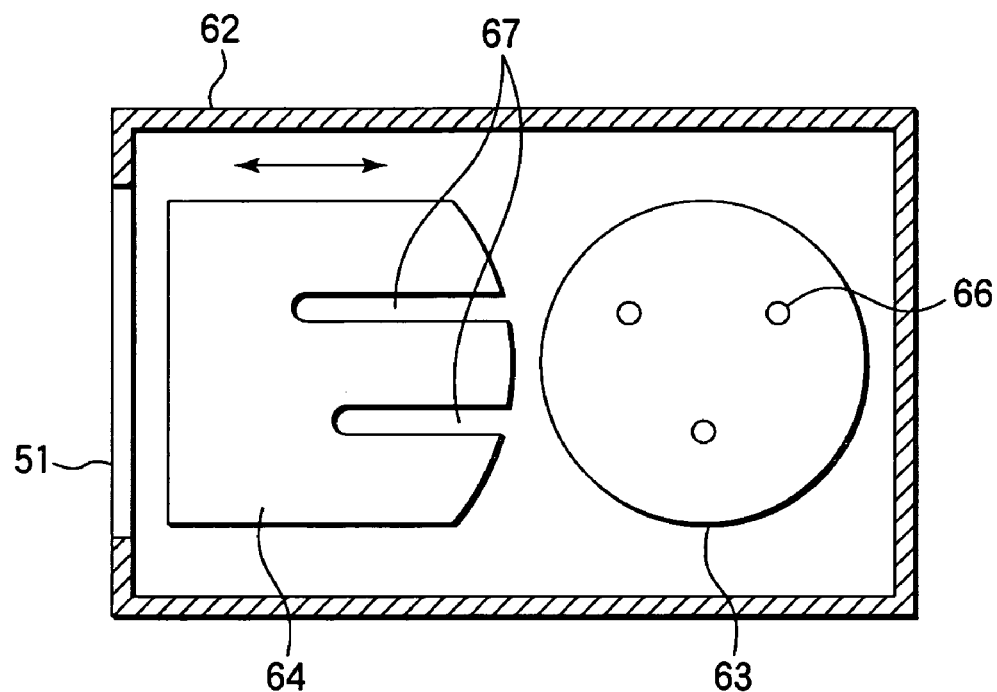
FIG. 8A is a horizontal plan view showing a heating and cooling unit (CHP) installed in the coating and developing apparatus in FIG. 3.
Figure 8B:
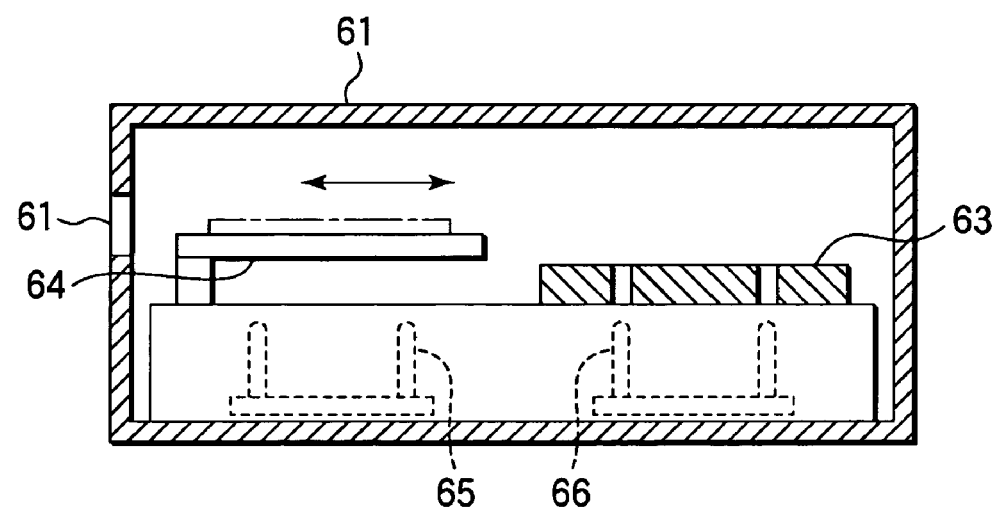
FIG. 8B is a vertical side view of the showing the heating and cooling unit (CHP)

Next, the heating units (CHP, PEB, POST) will be explained. Each of the heating units includes a heating plate 63 and a cooling plate 64 which also serves as a transfer arm, as shown in FIGS. 8A and 8B. The heating unit has such a structure as to carry out heating and cooling by a single unit by transferring wafers W between each of the main transfer mechanisms A1 to A5 and the heating plate 63 using the cooling plate 64. In FIGS. 8A and 8B, reference numerals "65" and "66" denote lift pins for transferring each wafer, and reference numeral "67" denotes cutaways through which the lift pins 65 and 66 pass.

The interface block S3 will be discussed next. The interface block S3 has an interface-block transfer mechanism 43 for transferring wafers W to and from the shelf unit U6 of the process block S2 and the exposure apparatus S4, and a cooling unit 44 which cools the wafers W. The cooling unit 44 adjusts the temperature of each wafer W to the temperature inside exposure apparatus S4 with high accuracy in advance.

The interface-block transfer mechanism 43 serves as wafer transfer means (transfer means for interface) intervened between the process block S2 and the cooling unit 44. In the embodiment, the interface-block transfer mechanism 43 is so constructed as to be movable forward and backward, liftable, and rotatable about the vertical axis to transfer wafers W to and from the second transfer stages TRS6 to TRS9 of the first to fourth unit blocks B1 to B4. The interface-block transfer mechanism 43 may be constructed in such a way as to transfer wafers W to and from the second transfer stages TRS6 to TRS10 of all the unit blocks B1 to B5.

The details of the wafer transfer will be given below.

Figure 10:
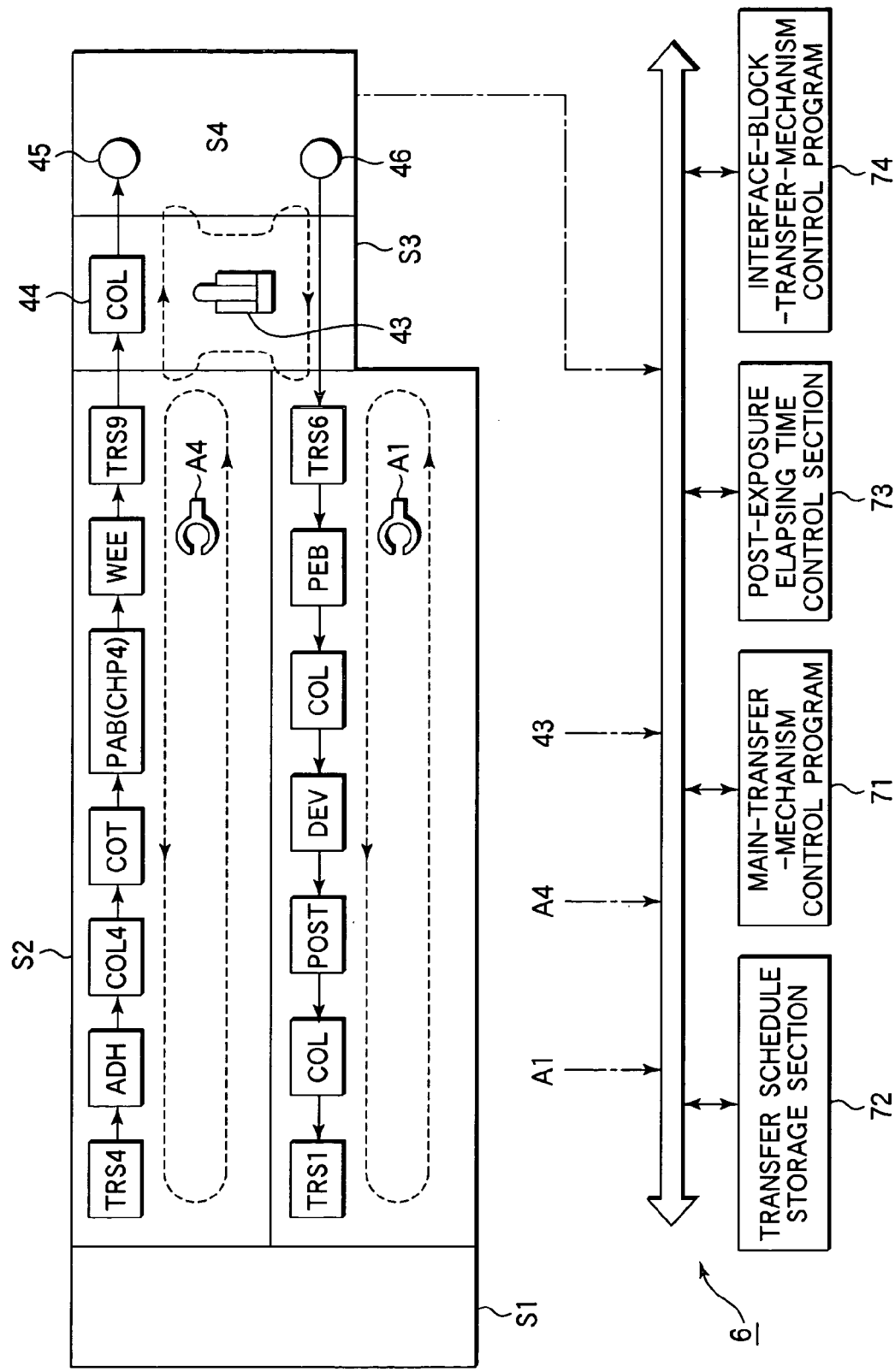
FIG. 10 is an exemplary diagram for explaining the flow of a wafer in the coating and developing apparatus, a transfer area of each transfer mechanism and a control section.

FIG. 10 is a diagram illustrating the transfer order for wafers W in the unit block (COT layer) B4 for forming a resist film and the unit block (DEV layer) B1 for performing a developing process both in the process block S2, the interface block S3 and the exposure apparatus S4, and the structure of the control device 6. As shown in the diagram, the exposure apparatus S4 has a carry-in stage 45 and a carry-out stage 46. While the control device 6 controls the general transfer system of the developing apparatus, FIG. 10 shows merely those essential portions of the control device 6 in the embodiment. The control device 6 includes a main-transfer-mechanism control program 71, a transfer schedule storage section 72, a post-exposure elapsing time control section 73, and an interface-block-transfer-mechanism control program 74.

The main-transfer-mechanism control program 71 controls the main transfer mechanisms A1 to A3 of the unit blocks B1 to B3 for coating-film formation referring the transfer schedule stored in the transfer schedule storage section 72, and controls the main transfer mechanisms A1 and A2 of the unit blocks B1 and B2 for development based on data read from the post-exposure elapsing time control section 73 in addition to referring to the transfer schedule.

The transfer schedule stored in the transfer schedule storage section 72 represents the time sequential correlation between each module and wafers W, given that places where wafers W are to be placed are called modules. FIG. 11 illustrates one part of the transfer schedule, and phases 1, 2 and so forth indicate the correlation between modules and wafers (A01 to A10) in one transfer cycle, the layout of the modules being shown in the upper column. Those modules which are laid out horizontally are either process units or transfer stages, and are PEB (post-exposure baking unit), COL (cooling unit), DEV (developing unit), LHP (post-development heating unit), COL (cooling unit), and TRS1 (transfer stage) located in the unit block B1 for development. Note that the transfer stage TRS6 is omitted. The layout of the modules is in the order of the wafer flow, and corresponds to the layout of the modules in FIG. 10.

For example, phase 1 indicates that the first wafer A01 or the top wafer in the lot is positioned at a PEB. Phase 6 indicates that the wafers A06, and A02 to A05 are positioned at five PEBs, and the wafer A01 is positioned at a COL. The main-transfer-mechanism control program 71 reads the phases of the transfer schedule in order, and transfers wafers in such a way as to bring about the states corresponding to the read phases. As the phases are read in order to transfer wafers, therefore, the wafer transfer is carried out in such a way that the wafers are transferred, one by one, to a module following the previous module by one in the order. Note that wafers in the PEB stay for five phases (five cycles in the transfer cycle).

The interface-block-transfer-mechanism control program 74 controls the interface-block transfer mechanism 43. The interface-block-transfer-mechanism control program 74 performs such control that when a wafer after exposure is placed on the carry-out stage 46 of the exposure apparatus S4, the wafer is transferred to the transfer stage TRS6 by the highest priority, and in case where the interface-block transfer mechanism 43 has already moved to another transfer operation when a wafer after exposure is placed at the carry-out stage 46, the interface-block transfer mechanism 43 moves toward the carry-out stage 46 to receive the wafer after exposure after the transfer operation is completed. At the stage where the interface-block transfer mechanism 43 is moving toward a cooling unit 44 to transfer a wafer to the carry-in stage 45 of the exposure apparatus S4 from the cooling unit 44, for example, the interface-block-transfer-mechanism control program 74 controls the interface-block transfer mechanism 43 to move toward the carry-out stage 46 to receive the wafer after exposure after wafer transfer to the carry-in stage 45 is completed.

As mentioned earlier, it is important to make the time elapsed after exposure of each wafer to the initiation of heating in the post-exposure baking unit (post-exposure elapsing time) constant. For that purpose, in this embodiment, to make the post-exposure elapsing time constant between when a wafer is transferred to the transfer stage TRS6 immediately upon placement of the wafer to the carry-out stage 46 of the exposure apparatus S4 and when a wafer is transferred to the transfer stage TRS6 with a little delay from the placement of the wafer to the carry-out stage 46, the main transfer mechanism A1 of the DEV layer stands by in front of the transfer stage TRS6 for a while after a wafer after exposure is transferred to the transfer stage TRS6, then transfers the wafer to the cooling plate 64 (see FIGS. 8A and 8B) in the post-exposure baking unit (PEB) from the transfer stage TRS6 in the former case, and the main transfer mechanism A1 transfers a wafer to the PEB from the transfer stage TRS6 immediately in the latter case.

The post-exposure elapsing time is set to a maximum time in consideration of the latest timing in timings at which the interface-block transfer mechanism 43 receives a wafer after exposure at the carry-out stage 46 since the carry-out of the wafer. The maximum time occurs when the placement of a wafer after exposure on the carry-out stage 46 overlaps the timing immediately after the interface-block transfer mechanism 43 initiates another transfer operation. For any wafer, the time for each wafer to stay at the transfer stage TRS6, i.e., the timing at which the main transfer mechanism A1 takes out a wafer from the transfer stage TRS6, is adjusted in such a way that the post-exposure elapsing time becomes the maximum time. The timing at which the main transfer mechanism A1 goes to receive a wafer from the transfer stage TRS6, therefore, depends on a time Te from the point where a wafer after exposure has been placed at the carry-out stage 46 and to the point where the wafer is placed at the transfer stage TRS6, and the post-exposure elapsing time control section 73 performs control in such a way that the main transfer mechanism A1 goes to the transfer stage TRS6 to receive a wafer at the timing corresponding to the time obtained by subtracting Te from the maximum time Tm from the point of placement of a wafer after exposure on the carry-out stage 46 to the point of transfer of the wafer to the transfer stage TRS6. A more detailed description of this control will be given later.

The control device 6 is storing control programs necessary to control the processes of the overall apparatus including the above-described operations, and programs or recipes for allowing the individual components to execute the associated processes according to the process conditions. The recipes may be stored on a hard disk or a semiconductor memory, or may be stored in a portable memory medium, such as CDROM or DVD, and set at predetermined positions therein. Further, the recipes may be transmitted, as needed, via a dedicated circuit from another apparatus.

The operation of the resist pattern forming apparatus with the above-described structure will be described below.

The apparatus can perform any of the process of forming an antireflection film at both the top and bottom of the resist film, the process of forming an antireflection film at either the top or the bottom of the resist film, and the process of forming a resist film without forming an antireflection film. To make the description as simple as possible, the following description will be given of a case where the resist film is formed using only the COT layer or the fourth unit block B4, then a developing process is carried out using the DEV layer or the first unit block B1.

To begin with, the overall flow of wafers W will be discussed. First, the carrier 20 is transferred to the carrier block S1 from outside. Next, the carrier-block transfer mechanism C takes out one wafer W from within the carrier 20. Then, the wafer W is transferred to the first transfer stage TRS-F of the shelf unit U5 of the second unit block B2. Next, the wafer W is transferred to the first transfer section TRS4 with the first sub-transfer mechanism 41, and is transferred to the main transfer mechanism A4 of the COT layer B4. In the COT layer B4, as shown in FIG. 10, the main transfer mechanism A4 transfers a wafer the hydrophobic process unit (ADH), the cooling unit (COL), the COT (coating unit 31), the heating unit (CHP), the periphery exposure apparatus (WEE), and the transfer stage TRS9 of the shelf unit U6 in the named order, thereby forming a chemically amplified resist film.

Subsequently, the wafer W at the transfer stage TRS9 is transferred to the exposure apparatus S4 via the cooling unit (COL) 44 by the interface-block transfer mechanism 43, and undergoes an exposure process in the exposure apparatus S4. The transfer stage TRS9 may be designed to have multiple stages which serve as buffer mounting sections, or a buffer cassette may be provided in the interface block S3 interface block S3 so that a wafer is temporarily placed on the buffer cassette before being transferred to the exposure apparatus S4.

The wafer W after exposure is carried out on the carry-out stage 46 and is transferred to the transfer stage TRS6 of the DEV layer B1. The wafer W on the stage TRS6 is received by the main transfer mechanism A1 of the DEV layer B1, and is transferred to the post-exposure baking unit (PEB), the cooling unit (COL), the developing unit (DEV), the heating unit (POST), the cooling unit (COL) and the transfer stage TRS1 in the named order to undergo a predetermined developing process. The wafer W which has undergone the developing process is returned to the original carrier 20, mounted on the carrier block S1, from the transfer stage TRS1 by the carrier-block transfer mechanism C.

The wafer transfer in the process block S2 is carried out in the COT layer in a similar way to the one explained on wafer transfer in the DEV layer as an example referring to FIG. 11, and in such a way that the wafers are transferred, one by one, to a module following the previous module by one in the order.

Next, a detailed description will now be given of how to transfer an exposed wafer to the post-exposure baking unit (PEB) of the DEV layer.

A wafer exposed in the exposure apparatus S4 is placed on the carry-out stage 46 as shown in FIG. 10. At this time, the exposure apparatus S4 sends a carry-out ready signal to the control device 6, and the interface-block-transfer-mechanism control program 74 instructs the interface-block transfer mechanism 43 to go to the carry-out stage 46 to receive a wafer after exposure. If the interface-block transfer mechanism 43 has already begun another transfer operation, the instruction is output after the transfer operation is finished. The "transfer operation" means an operation from the point when the interface-block transfer mechanism 43 starts moving toward a process unit or a module, e.g., the cooling unit (COL), to the point when the wafer is transferred to the next module or the carry-in stage 45.

The post-exposure elapsing time control section 73 activates a timer upon reception of the carry-out ready signal and measures the time Te up to the point when the interface-block transfer mechanism 43 transfers the wafer on the carry-out stage 46 to the transfer stage TRS6, and instructs the main transfer mechanism A1 of the completion of the preparation for wafer carry-out at the timing corresponding to the time obtained by subtracting Te from the maximum time Tm from the point of placement of the wafer after exposure on the carry-out stage 46 to the point of transfer of the wafer to the transfer stage TRS6.

Figure 12:
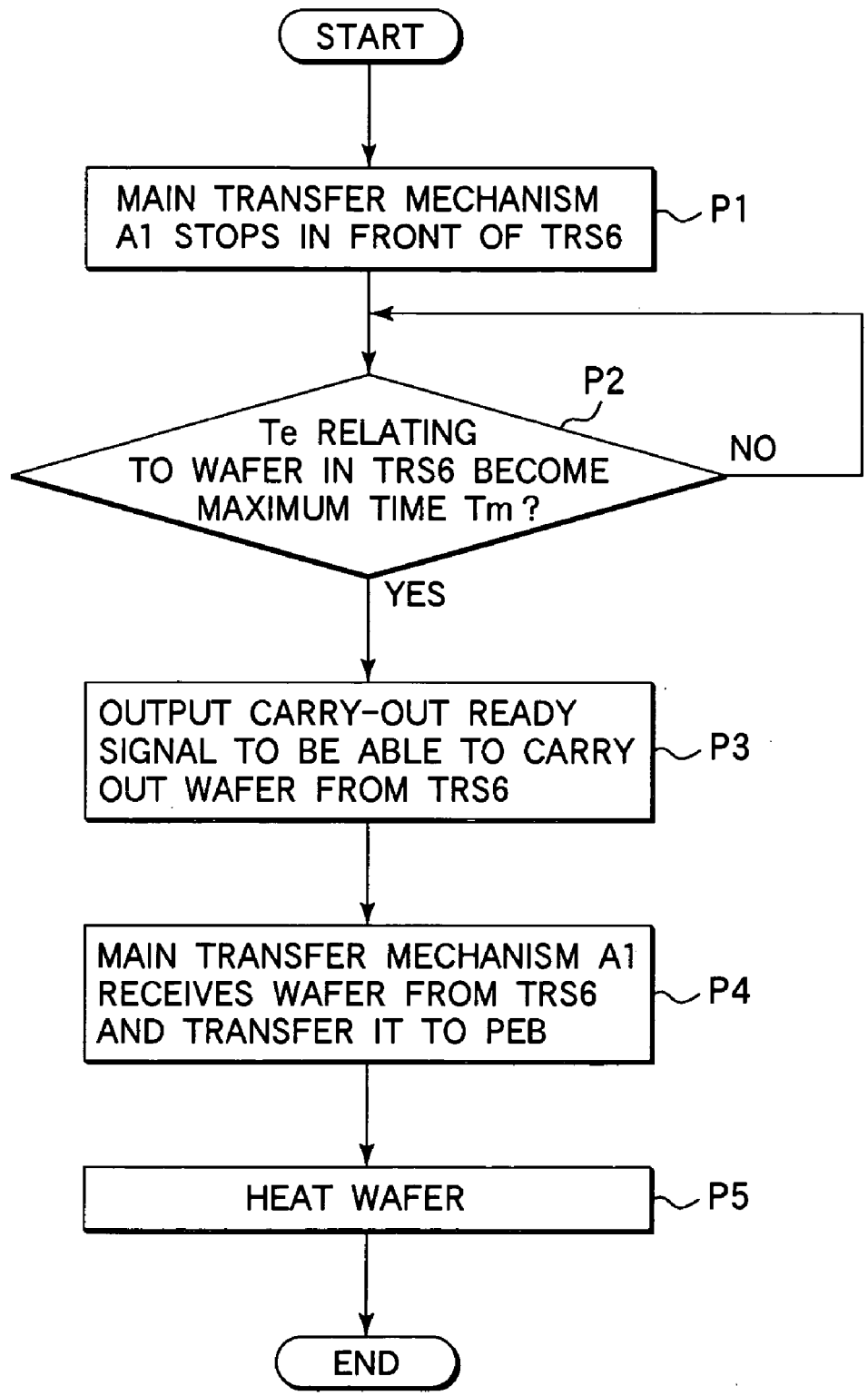
FIG. 12 is a flowchart illustrating a control flow from the point of transfer of a wafer after exposure to a transfer stage via an interface to the point of transfer of the wafer to a post-exposure baking unit (PEB)

The control operation then will be described referring to the flowchart of the control program of the main transfer mechanism A1 as illustrated in FIG. 12.

First, the main transfer mechanism A1 stops in front of the transfer stages TRS6 (step P1). The post-exposure elapsing time control section 73 measures the time Te elapsed since generation of the carry-out ready signal indicating the readiness of the carry-out stage 46 from the exposure apparatus S4 and determines whether the time Tm has reached the maximum time Tm or not (step P2). When post-exposure elapsing time control section 73 decides that the time Tm has reached the maximum time Tm, it outputs the carry-out ready signal (step P3). As a result, the main transfer mechanism A1 receives the wafer in the transfer stages TRS6 and changes it with a wafer undergone a heating process in the post-exposure baking unit (PEB) (step P4). Note that changing wafers is carried out regardless of whether a previous wafer is present in the post-exposure baking unit (PEB) or not. The wafer transferred into the post-exposure baking unit (PEB) is transferred via the cooling plate 64 to the heating plate 63 to undergo a heating process (step P5).

Figure 13A:
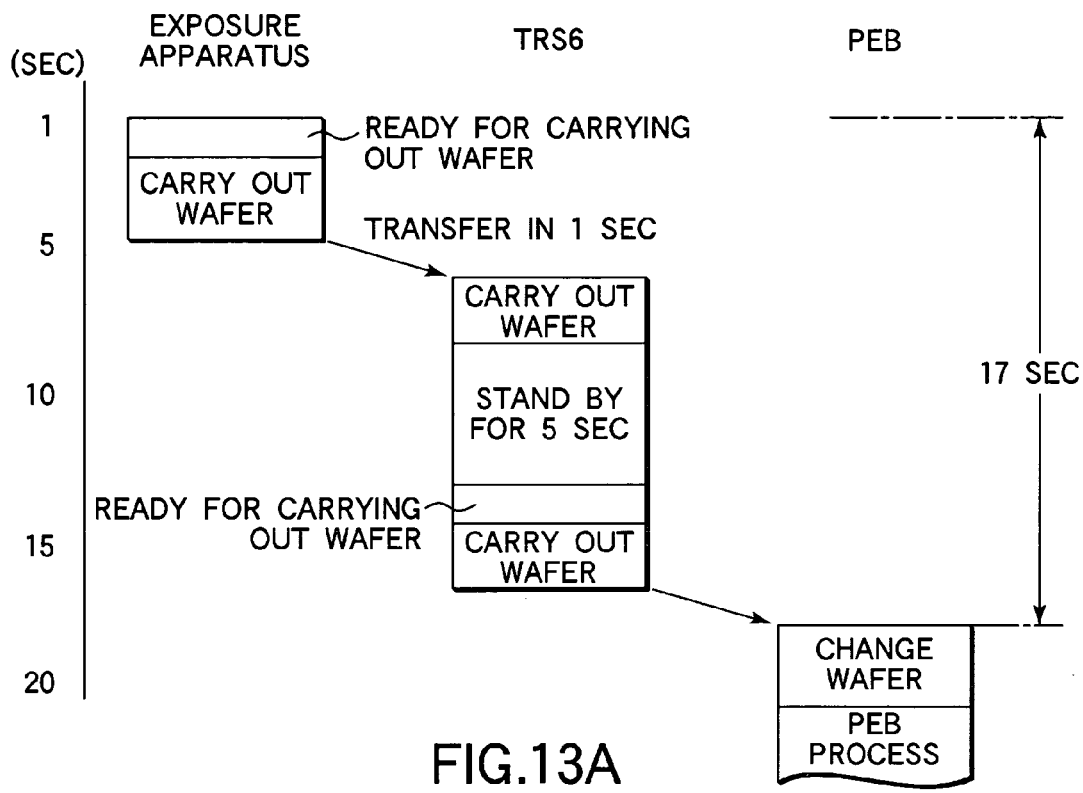
FIG. 13A is an explanatory diagram illustrating a case where a wafer is standing by on the transfer stage when a wafer after exposure is transferred to the transfer stage via the interface, and an interface-block transfer mechanism is ready to move toward a carry-out stage immediately when a carry-out ready signal is output from an exposure apparatus.
Figure 13B:
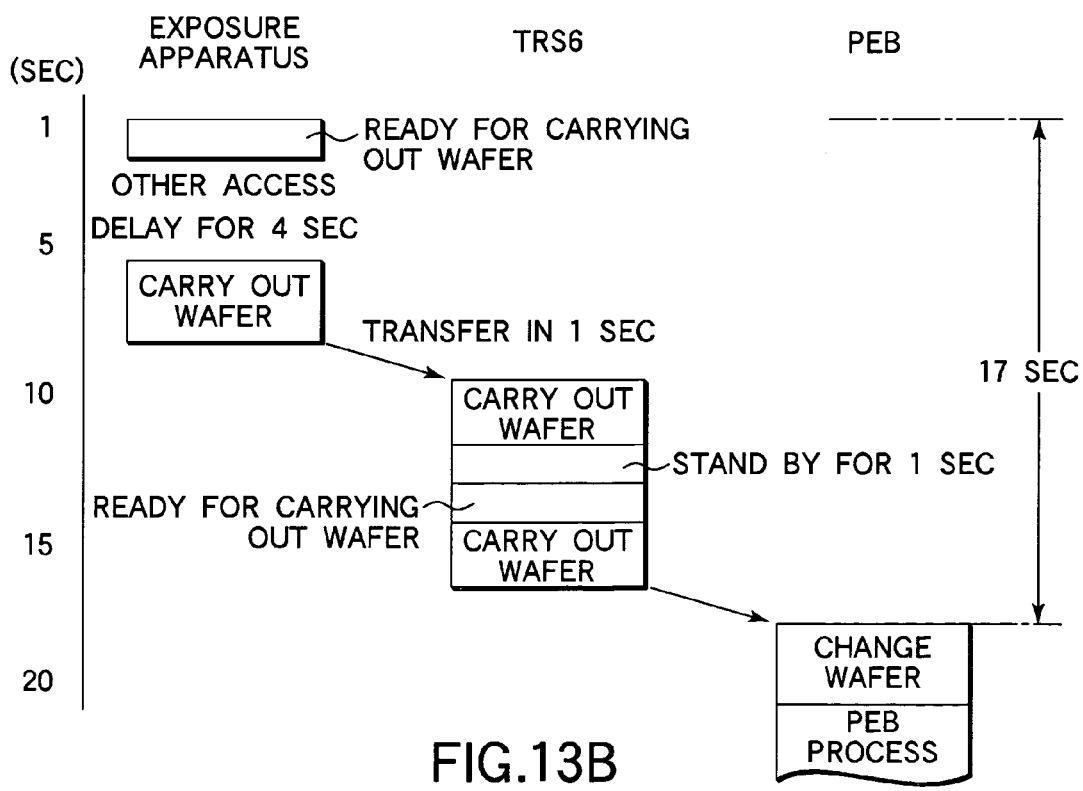
FIG. 13B is an explanatory diagram illustrating a case where a wafer is standing by on the transfer stage when a wafer after exposure is transferred to the transfer stage via the interface, and the interface-block transfer mechanism has just started another transfer operation when the carry-out ready signal is output from the exposure apparatus.

FIGS. 13A and 13B are diagrams illustrating the relationship between the elapsed time Te and wafer transfer, and show the states of wafers in the exposure apparatus S4, the transfer stage TRS6 and the post-exposure baking unit (PEB) from the left. The leftmost numerals indicate the times elapsed since the carry-out of the wafer to the carry-out stage 46 of the exposure apparatus S4.

FIG. 13A shows a case where the interface-block transfer mechanism 43 is ready to move toward the carry-out stage 46 immediately when a wafer is carried onto the carry-out stage 46 and the carry-out ready signal is generated from the exposure apparatus S4. As the wafer at this time has the time left to the maximum time Tm since carry-in of the wafer to the transfer stage TRS6, the carry-out ready signal indicating that the wafer can be transferred from the transfer stage TRS6 is output in the control device 6 after standing by for 5 seconds.

Thereafter, the main transfer mechanism A1 receives the wafer from the transfer stage TRS6 and transfers the wafer to the pre-exposure baking unit (PEB). Specifically, the main transfer mechanism A1 stands by in front of the transfer stage TRS6 so that the time for the wafer on the transfer stage TRS6 to be carried out since the generation of the carry-out ready signal at the carry-out stage 46 becomes, for example, 17 seconds. At this time, the wafer stands by in the transfer stage TRS6. As the time for a wafer to undergo a heating process in the post-exposure baking unit (PEB) after having been transferred to the main transfer mechanism A1 is always constant, the post-exposure elapsing time for wafers is managed by controlling the time of 17 seconds.

FIG. 13B shows a case where the interface-block transfer mechanism 43 has just started another transfer operation when the carry-out ready signal is generated from the exposure apparatus S4. Therefore, the timing at which the wafer is carried out from the carry-out stage 46 is delayed by 4 seconds from the generation of the wafer carry-out ready signal. The standby time for the wafer in the transfer stage TRS6 is thus one second, shorter by 4 seconds than that in the case of FIG. 13A. This timing control can always keep the post-exposure elapsing time constant.

According to the embodiment, the unit blocks are separated to the unit blocks B3 to B5 for coating-film formation and the unit blocks B1 and B2 for development, and the main transfer mechanisms A3 to A5, which are the transfer means to transfer a wafer between units to form a resist film, are set independent of the main transfer mechanisms A1 and A2 which transfer a wafer between units to execute a developing process. Even when the main transfer mechanism A1 in the DEV layer B1 or the main transfer mechanism A2 in the DEV layer B2 stands by, the wafer transfer in the unit blocks B3 to B5 for coating-film formation is not influenced, making it possible to avoid reduction of the throughput.

Paying attention to this point, the wafer standby time in the transfer stage TRS6 is adjusted to make the individual post-exposure elapsing times equal, so that the main transfer mechanism A1 of the DEV layer B1 is made to stand by in front of the transfer stage TRS6 in the above-described embodiment.

Executing the adjustment of each post-exposure elapsing time in the transfer stage TRS6, not in the heating unit (post-exposure baking unit (PEB)), can suppress an increase in the number of the heating units (post-exposure baking unit (PEB)) which would otherwise be originated from an improvement on the throughput.

Given that the number of wafers to be processed in the pattern forming apparatus per hour, for example, is 150, wafers are transferred at the interval of 24 seconds (3600 seconds/150) as mentioned earlier. In this case, the if the time required for the heating process in the post-exposure baking unit (PEB) is 120 seconds (90 seconds for heating+12 seconds for cooling+18 seconds for transfer), 4 seconds are not added as the standby time for the post-exposure baking unit (PEB), so that the wafer standby time in the post-exposure baking unit (PEB) becomes 120 seconds (whereas it becomes 124 seconds=120 seconds+4 seconds if the standby time of 4 seconds is needed in the PEB). With the wafer transfer cycle time being 24 seconds, 120 seconds÷24=5, so that the number of required heating units (PEB) would be 5 which is one shorter than the number required in the case where the wafer should stand by in the PEB. Because the post-exposure baking unit (PEB) is very expensive as mentioned earlier, the use of the embodiment can contribute to reducing the cost for the apparatus.

The embodiment is intended to clarify the technical contents of the invention and should not be considered restrictive to the specific example, but can be worked out in various other forms within the spirit of the invention and within the scope of the appended claims.

For instance, although the unit blocks B3 to B5 for coating-film formation and the unit blocks B1 and B2 for development are separated from one another by stacking the unit blocks one on another in the foregoing description of the embodiment, similar effects are obtained when the unit blocks are laid out horizontally, for example, in parallel to one another, to be separated from one another.

What is claimed is:

1. A coating and developing apparatus comprising:
   a process block which forms a coating film including a resist film on a substrate, develops the coating film after exposure, and performs a heat processing accompanying those film formation and development;
   an interface block, provided between said process block and an exposure apparatus which performs an exposure process on the coating film formed on the substrate, for transferring the substrate between said process block and said exposure apparatus;
   a transfer stage on which a substrate after exposure from said interface block is temporarily placed at a time of transferring the substrate to said process block; and
   a control section which controls substrate transfer,
   wherein after a coating film is formed on a substrate in said process block, the substrate is transferred to said exposure apparatus via said interface block, and a substrate after exposure is returned to said process block via said interface block where post-exposure heating is performed and then a developing process is performed,
   said process block comprises:
   a unit block for coating-film formation having a plurality of process units for performing a series of processes for a coating process, which include a coating unit for applying a coating liquid to a substrate and a heating unit for heating the substrate applied with said coating liquid, and a coating-film-formation-unit-block transfer mechanism for transferring a substrate among said plurality of process units; and
   a unit block for development having a plurality of process units for performing a series of processes for a developing process, which include a post-exposure heating unit for heating an exposed substrate and a developing-liquid applying unit for applying a developing liquid to the heated substrate after exposure, and a developing-process-unit-block transfer mechanism for transferring a substrate among said plurality of process units,
   said interface block includes an interface-block transfer mechanism for transferring a substrate between said process block and said exposure apparatus, and
   said control section adjusts a timing for said developing-process-unit-block transfer mechanism to receive a substrate in such a way that a time for said post-exposure heating unit to start heating after exposure of the substrate becomes a preset time, when the substrate after exposure is transferred to said transfer stage by said interface-block transfer mechanism.

2. The coating and developing apparatus according to claim 1, wherein said unit block for development comprises a plurality of modules on which substrates are to be placed and which include said plurality of process units,
   said developing-process-unit-block transfer mechanism has at least two arms, and
   said control section performs such control as to execute one transfer cycle by sequentially performing substrate transfer in such a way as to transfer a substrate placed on each of said modules to a module following by one, and to go to a next transfer cycle after said one transfer cycle is finished.

3. The coating and developing apparatus according to claim 1, wherein said time preset in said control section for said post-exposure heating unit to start heating after exposure of a substrate is set to a maximum time in consideration of a latest timing in timings at which said interface-block transfer mechanism receives a substrate after exposure from a carry-out stage in said exposure apparatus after the substrate is carried out to said carry-out stage, and said control section adjusts said timing for said developing-process-unit-block transfer mechanism to receive a substrate from said transfer stage according to a timing at which said interface-block transfer mechanism receives a substrate after exposure from said carry-out stage.

4. The coating and developing apparatus according to claim 1, wherein said unit block for coating-film formation and said unit block for development are stacked on each other.

5. A coating and developing method which performs a coating and developing process using a coating and developing apparatus comprising:
   a process block which forms a coating film including a resist film on a substrate, develops the coating film after exposure, and performs a heat processing accompanying those film formation and development;
   an interface block, provided between said process block and an exposure apparatus which performs an exposure process on the coating film formed on the substrate, for transferring the substrate between said process block and said exposure apparatus; and
   a transfer stage on which the substrate after exposure from said interface block is temporarily placed at a time of transferring the substrate to said process block,
   said process block comprises:
   a unit block for coating-film formation having a plurality of process units for performing a series of processes for a coating process, which include a coating unit for applying a coating liquid to a substrate and a heating unit for heating the substrate applied with said coating liquid, and a coating-film-formation-unit-block transfer mechanism for transferring a substrate among said plurality of process units; and a unit block for development having a plurality of process units for performing a series of processes for a developing process, which include a post-exposure heating unit for heating an exposed substrate and a developing-liquid applying unit for applying a developing liquid to the heated substrate after exposure, and a developing-process-unit-block transfer mechanism for transferring a substrate among said plurality of process units, said interface block includes an interface-block transfer mechanism for transferring a substrate between said process block and said exposure apparatus, and said method comprises:

forming a coating film on a substrate in said unit block for coating-film formation of said process block;

transferring the substrate having the coating film formed thereon to said exposure apparatus by said interface-block transfer mechanism;

transferring a substrate after exposure to said transfer stage by said interface-block transfer mechanism;

transferring the substrate after exposure on said transfer stage to said post-exposure heating unit in said unit block for development;

performing a heat processing on the substrate after exposure by said post-exposure heating unit;

performing a developing process by said developing-liquid applying unit in said developing-process-unit-block transfer mechanism unit block for development; and adjusting a timing for said developing-process-unit-block transfer mechanism to receive a substrate from said transfer stage in such a way that a time for said heating unit to start heating after exposure of the substrate becomes a preset time.

6. A computer readable storage medium which containing software which, when executed, causes a computer to control a coating and developing apparatus comprising:

a process block which forms a coating film including a resist film on a substrate, develops the coating film after exposure, and performs a heat processing accompanying those film formation and development;

an interface block, provided between said process block and an exposure apparatus which performs an exposure process on the coating film formed on the substrate, for transferring the substrate between said process block and said exposure apparatus; and a transfer stage on which a substrate after exposure from said interface block is temporarily placed at a time of transferring the substrate to said process block, said process block comprises:

a unit block for coating-film formation having a plurality of process units for performing a series of processes for a coating process, which include a coating unit for applying a coating liquid to a substrate and a heating unit for heating the substrate applied with said coating liquid, and a coating-film-formation-unit-block transfer mechanism for transferring a substrate among said plurality of process units; and a unit block for development having a plurality of process units for performing a series of processes for a developing process, which include a post-exposure heating unit for heating an exposed substrate and a developing-liquid applying unit for applying a developing liquid to said heated substrate after exposure, and a developing-process-unit-block transfer mechanism for transferring a substrate among said plurality of process units, said interface block includes an interface-block transfer mechanism for transferring a substrate between said process block and said exposure apparatus, and when executed, said software causes said computer to control said coating and developing apparatus in such a method comprising:

forming a coating film on a substrate in said unit block for coating-film formation of said process block;

transferring the substrate having the coating film formed thereon to said exposure apparatus by said interface-block transfer mechanism;

transferring a substrate after exposure to said transfer stage by said interface-block transfer mechanism;

transferring the substrate after exposure on said transfer stage to said post-exposure heating unit in said unit block for development;

performing a heat processing on the substrate after exposure by said post-exposure heating unit;

performing a developing process by said developing-liquid applying unit in said developing-process-unit-block transfer mechanism unit block for development; and adjusting a timing for said developing-process-unit-block transfer mechanism to receive a substrate from said transfer stage in such a way that a time for said heating unit to start heating after exposure of the substrate becomes a preset time.

* * * * *